United States Patent
Nishimoto et al.

(10) Patent No.: US 6,649,985 B1
(45) Date of Patent: Nov. 18, 2003

(54) INSULATED-GATE SEMICONDUCTOR DEVICE FOR A RECTIFIER

(75) Inventors: Ikuo Nishimoto, Tokyo (JP); Tatsuya Ueno, Tokyo (JP)

(73) Assignee: Yamatake Corporation, Tokyo (JP)

( * ) Notice: Subject to any disclaimer, the term of this patent is extended or adjusted under 35 U.S.C. 154(b) by 0 days.

(21) Appl. No.: 10/332,927

(22) PCT Filed: Jul. 14, 2000

(86) PCT No.: PCT/JP00/04741
§ 371 (c)(1),
(2), (4) Date: Jan. 13, 2003

(87) PCT Pub. No.: WO02/07225
PCT Pub. Date: Jan. 24, 2002

(51) Int. Cl.$^7$ ............................................. H01L 29/76
(52) U.S. Cl. ...................... 257/401; 257/369; 257/379; 257/531
(58) Field of Search ................. 257/401, 369, 257/379, 531

(56) References Cited

U.S. PATENT DOCUMENTS 4,139,880 A * 2/1979 Ulmer et al. ............... 361/246

FOREIGN PATENT DOCUMENTS

| JP | 54-60550 A | 5/1979 |
|----|------------|--------|
| JP | 5-115179 A | 5/1993 |
| JP | 6-204468 A | 7/1994 |
| JP | 8-251925 A | 9/1996 |
| JP | 10-210751 A | 8/1998 |

OTHER PUBLICATIONS

N. Takeda; "Ball Semiconductor Technology and Its Application to MEMS"; 2000 IEEE; pp. 11–16.
H. Nakano et al; "Ball Semiconductor Technology and Its Future"; 1999; Ball Semiconductor Incorporated; pp. 1–8.
Design News; "Chip Making Gets On The Ball", Apr. 19, 1999; pp. 85–86.
Microfilm of the specification and drawings annexed to the request of Japanese Utility Model Appln. No. 81001/1981 (Laid–open No. 193243/1982) (Hitachi Ltd.) Jun. 3, 1981.

* cited by examiner

Primary Examiner—Mark V. Prenty
(74) Attorney, Agent, or Firm—Frishauf, Holtz, Goodman & Chick, P.C.

(57) ABSTRACT

An insulated-gate semiconductor device comprises a source region (S) formed on a predetermined semiconductor substrate such as a ball semiconductor, a drain region (D) formed on the semiconductor substrate at a distance from the source region; and a gate electrode (G) formed on the semiconductor substrate with an insulating layer interposed therebetween to create a channel region between the source and drain regions. The insulated-gate semiconductor device is characterized in that the drain region and the source region are formed asymmetrically with respect to the channel region suited to be incorporated in a rectifier circuit for full-wave rectification of power supplied through inductive coupling of coils. In particular, the channel region is formed to surround the source region while the drain region is formed outside the channel region so that the effective channel width adjoining the source region may be different from that adjoining the drain region.

5 Claims, 5 Drawing Sheets

INSULATED-GATE SEMICONDUCTOR DEVICE FOR A RECTIFIER

This application is a U.S. National Phase Application under 35 USC 371 of International Application PCT/JP00/04741 filed Jul. 14, 2000.

1. Technical Field

The present invention relates to an insulated-gate semiconductor device suited to be incorporated into a rectifier circuit for performing full-wave rectification of power, which is supplied thereto by inductive coupling through, for example, a coil, to generate internal power.

2. Description of the Related Art

In recent years, there has been proposed a ball semiconductor wherein a functional element such as a transistor, a sensor or the like and a semiconductor integrated circuit or performing certain processing functions are formed on a ball semiconductor chip having a diameter of about 1 mm. As shown in FIG. 3, for example, this kind of ball semiconductor includes a ball semiconductor chip 1 and a coil (loop antenna) 2 disposed on the surface of the chip 1 and functioning as an antenna element. This ball semiconductor operates as power, which is generated through inductive coupling at the coil 2, is supplied from outside. This semiconductor is also constructed to receive and transmit an information signal from and to an external device via the coil.

As shown in FIG. 4, an integrated circuit formed on the semiconductor chip 1 includes, for example, a power supply part 3 which receives power (electromagnetic energy) from the external device via the coil 2 to generate an internal power; a receiving circuit 4 for receiving the information signal from the external device via the coil 2; and a transmitting circuit 5 for transmitting the information signal via the coil 2 to the external device. The integrated circuit further comprises a main circuit 6 including a calculating control part and the like, a sensor circuit 7 such as a temperature sensor, and a memory 8. This integrated circuit performs a predetermined function as the main circuit 6 operates. Receiving and transmitting the information is carried out through modulation of the information signal, using the electromagnetic induction field for transmitting the power as a carrier.

As shown in FIG. 5, the power supply part 3 includes, for example, a rectifier circuit 10 performing full-wave rectification of the power generated through inductive coupling at the coil 2. The rectifier circuit 10 is constructed in such a way that p-MOS transistors 11, 12 and n-MOS transistors 13, 14, which are all insulated-gate semiconductor devices, are crossed-connected. The rectifier circuit 10 may also be configured such that the p-MOS transistors 11, 12 are diode-connected, respectively, as shown in FIG. 6.

As seen from FIG. 7 illustrating a cross sectional view, the n-MOS transistors 13, 14 are each constituted in such a way that an n-type source region 22 and a drain region 23 are formed on a p-type semiconductor substrate 21 at a predetermined interval therebetween, and that a gate electrode 25 is formed via an insulating layer 24 over the intermediate area between the source region 22 and the drain region 23, thereby forming a channel region 26 immediately under the gate electrode 25. The reference numerals 27 and 28 represent source and drain electrodes formed on the source region 22 and drain region 23, respectively.

Although not shown, the p-MOS transistors 11, 12 are constituted in such a way that a p type source region and drain region are formed on the p type semiconductor substrate via an n-well layer and that a channel region is formed immediately under a gate electrode which is formed via an insulating layer over the intermediate area between the source and drain regions.

The source electrode S and drain electrode D of each of the MOS transistors 11–14 are generally disposed symmetrically with respect to the gate electrode 25 (G), as shown in FIG. 8 illustrating a planar electrode pattern. As shown in FIG. 9, it is also possible to juxtapose pluralities of MOS transistors and to connect the electrodes S, D and G of the respective MOS transistors, respectively, in parallel to obtain an array configuration, thereby increasing the allowable current capacity.

As shown in FIG. 10, the rectifier circuit 10, which is constituted by the cross-connected MOS transistors 11, 12, 13, 14 as shown in FIG. 5, performs full-wave rectification of an input voltage (a dot - dash line A), thus providing a rectified wave as indicated by the dash line B. However, when a smoothing capacitor 15 is connected to the rectifier circuit 10, it is inevitable that the wave largely decreases in its direct current, as indicated by the thick solid line C in FIG. 10, component since the MOS transistors 11, 12 act as resistance. Specifically, when the input voltage applied to the gate electrode of the p-MOS transistor 11, 12 becomes lower than the voltage applied to the drain electrode D thereof due to charging of the capacitor 15, the p-MOS transistor 11, 12 comes to function as a discharge path for the electric charge stored in the capacitor 15, since the function of the source is exchanged with that of the drain. Consequently, the output voltage extracted via the capacitor 15 shows a waveform C with a level (voltage) which is nearly an average of the fully rectified voltage waveform B.

On the other hand, with the rectifier circuit 10 constituted by the diode-connected p-MOS transistors 11, 12 as shown in FIG. 6, the input voltage (a dot - dash line A) is fully rectified as denoted by the thin solid line D (in FIG. 10). The level of the full-wave rectified output obtained in this case is lower than the full-wave rectified output of the waveform B by an amount corresponding to the voltage drop in the p-MOS transistors 11, 12 functioning as a diode. However, even when the smoothing capacitor 15 is connected to the output side of this rectifier circuit 10, the p-MOS transistors 11, 12 do not act as a discharge path for the electric charge stored in the capacitor 15. This is because the p-MOS transistors 11, 12 function as a diode. Therefore, the output voltage extracted via the smoothing capacitor has a direct-current component smoothed along an envelope curve, as indicated by the dot - dot - dash line D in FIG. 10.

However, in order to cause the diodeoconnected p-MOS transistors 11, 12 of the rectifier circuit 10 to turn on without fail, it is necessary to apply a gate voltage higher than the threshold voltage of the transistors. In this case, however, there is a fear of a parasitic transistor acting due to this gate voltage, causing an undesirable current to flow into the semiconductor substrate 21.

DISCLOSURE OF THE INVENTION

The present invention was created in view of the above circumstances, and an object thereof is to provide an insulated-gate semiconductor device suited to constitute a rectifier circuit which is capable of obtaining a stable rectified output while restricting a discharge current of a smoothing capacitor, without entailing disadvantages incurred when MOS transistors are diode-connected.

Specifically, the present invention aims at providing an insulated-gate semiconductor device suited to attain a rectifier circuit which can obtain not an average output of full-wave rectified wave but an envelope-curved rectified output thereof even when a smoothing capacitor is incorporated.

Concretely, an insulated-gate semiconductor device of the present invention comprises a source region formed on a semiconductor substrate, a drain region formed on the semiconductor substrate at a distance from the source region, and a gate electrode disposed on the semiconductor substrate with an insulating layer interposed therebetween and forming a channel region between the source region and the drain region, wherein the drain region and the source region are asymmetrical with respect to the channel region.

Preferably, the channel region surrounds the source region, and the drain region is formed around the channel region. Since the drain region and the source region are thus asymmetrical, an effective gate length (gate width) as viewed from the source region is different from that as viewed from the drain region when the potential difference between the source and the drain is reversed. Thus, the insulated-gate semiconductor device for a rectifier circuit can restrain the discharge current generated when the device functions as a discharge path of a smoothing capacitor.

Another object of the present invention is to provide an arrayed insulated-gate semiconductor device for a rectifier circuit, wherein the source region includes a plurality of source regions formed on the semiconductor substrate at predetermined intervals, the drain region includes a plurality of drain regions each surrounding a corresponding one of the source regions, and the source electrodes formed on the respective source regions are connected in parallel. Further, the gate electrode includes a plurality of gate electrodes each disposed via an insulating layer to form a channel region between each of the source regions and a corresponding one of the drain regions.

Still further, the present invention is to provide a rectifier circuit for performing a full-wave rectification of power supplied thereto by inductive coupling of a coil, by the use of the insulated-gate semiconductor device configured as described above.

A ball semiconductor, for example, is used for the semiconductor substrate on which the insulated-gate semiconductor device for a rectifier circuit is constructed. That is, the object of the present invention is to provide an insulated-gate semiconductor device suited to construct a rectifier circuit for a power supply part of a ball semiconductor, for example, which is commonly used singly, in which a power supply unit such as a battery is difficult to incorporate, and in which electrical energy supplied from outside by inductive coupling or the like is received via a coil to generate internal power.

BEST MODE OF CARRYING OUT THE INVENTION

An insulated-gate semiconductor device for a rectifier circuit according to an embodiment of the present invention will be hereinafter described with reference to the accompanying drawings.

Figure 1A:
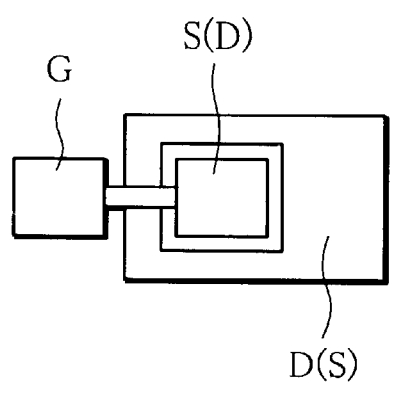
FIGS. 1(a) and 1(b) are plan views showing arrangement patterns of a source electrode, drain electrode and gate electrode in a insulated-gate semiconductor device for a rectifier circuit in accordance with one embodiment of the present invention.
Figure 1B:
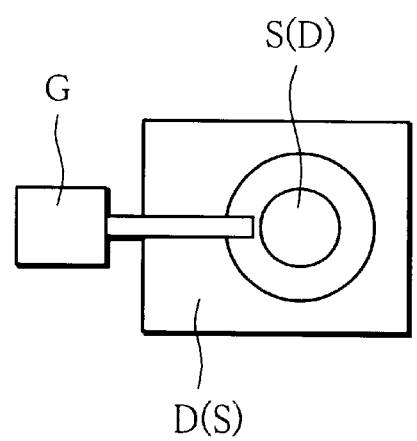

As shown in FIGS. 1(a) and 1(b) each illustrating a planar arrangement pattern composed of a source electrode S, drain electrode D and gate electrode G. the insulated-gate semiconductor device according to this embodiment is characterized in that the source region and the drain region are formed asymmetrical with respect to a channel region located therebetween and formed immediately under the gate electrode G. FIG. 1(a) shows an element structure wherein a frame-like gate electrode (channel region) G is disposed so as to surround a rectangular source electrode (source region), and a drain electrode (drain region) D is disposed around the gate electrode. FIG. 1(b) shows an element structure wherein a ring-like gate electrode (channel region) G is disposed so as to surround a circular source electrode (source region) S, and a drain electrode (drain region) D is disposed around the gate electrode. Needless to say, the gate electrode G is formed on a semiconductor substrate with an insulating layer sandwiched therebetween.

According to the insulated-gate semiconductor device having the above-identified element structure, the source region and the drain region are asymmetrical with respect to the channel region located therebetween. Therefore, the length (channel width) of the part of the source region adjoining the channel is different from that of the part of the drain region adjoining the channel. Thus, when the potential difference between the source electrode S and the drain electrode D is reversed so that the source and the drain regions come to perform each other's functions, the effective channel width is to change. As a result, the conductance for the insulated-gate semiconductor device does change to comply with the polarity change of the voltage applied between the source and drain.

Figure 5:
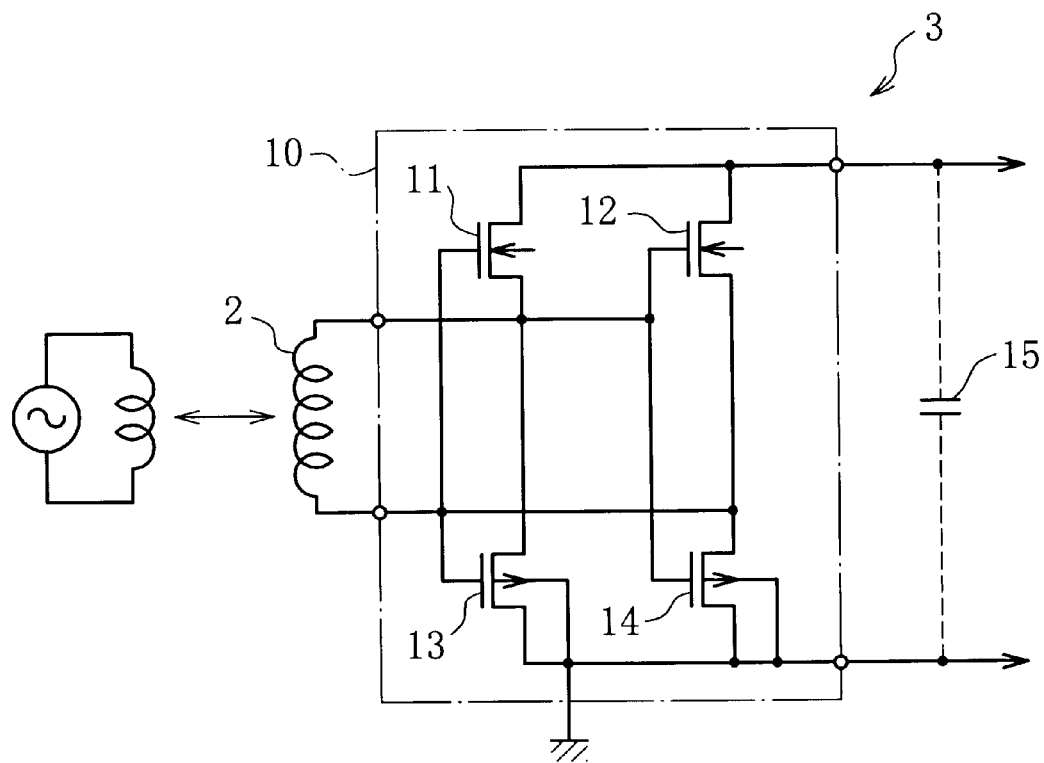
FIG. 5 is a diagram illustrating an exemplary configuration of a power supply part, especially of a rectifier circuit, arranged in a ball semiconductor.
Figure 6:
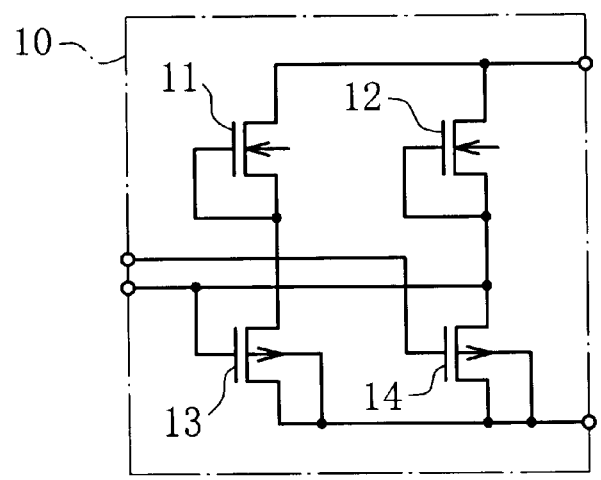
FIG. 6 is a diagram illustrating another exemplary configuration of the rectifier circuit.
Figure 7:
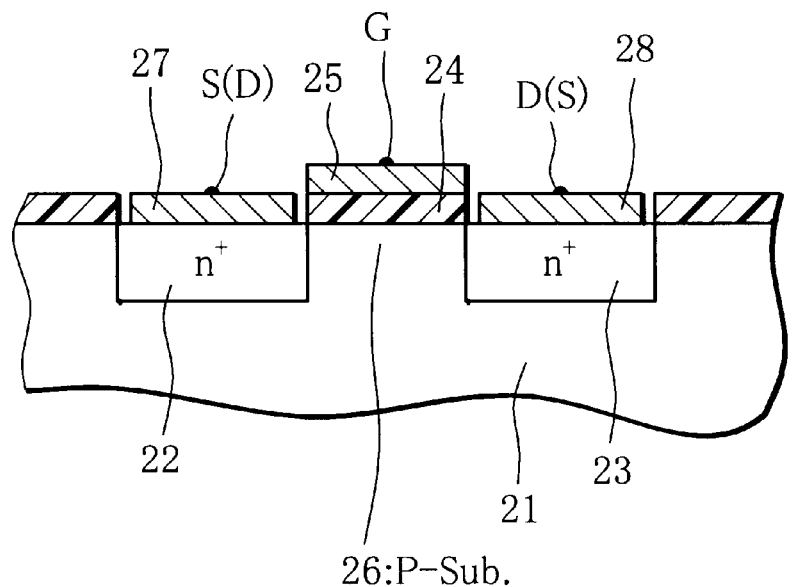
FIG. 7 is a cross sectional view schematically illustrating the structure of an insulated-gate semiconductor device used in a rectifier circuit.
Figure 8:
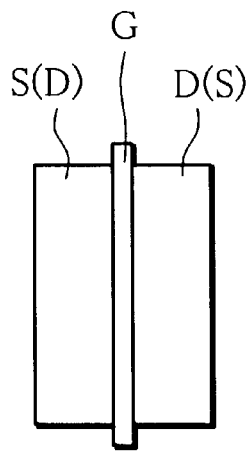
FIG. 8 is a view showing an arrangement pattern of a source electrode, drain electrode and gate electrode in an ordinary insulated-gate semiconductor device.
Figure 9:
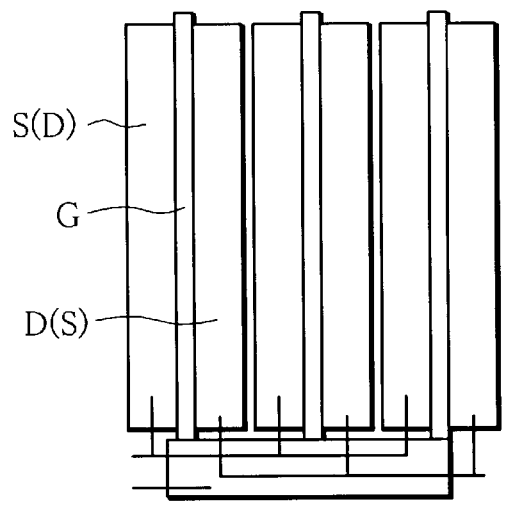
FIG. 9 is a view showing an arrangement pattern of source electrodes, drain electrodes and gate electrodes in an arrayed insulated-gate semiconductor.
Figure 10:
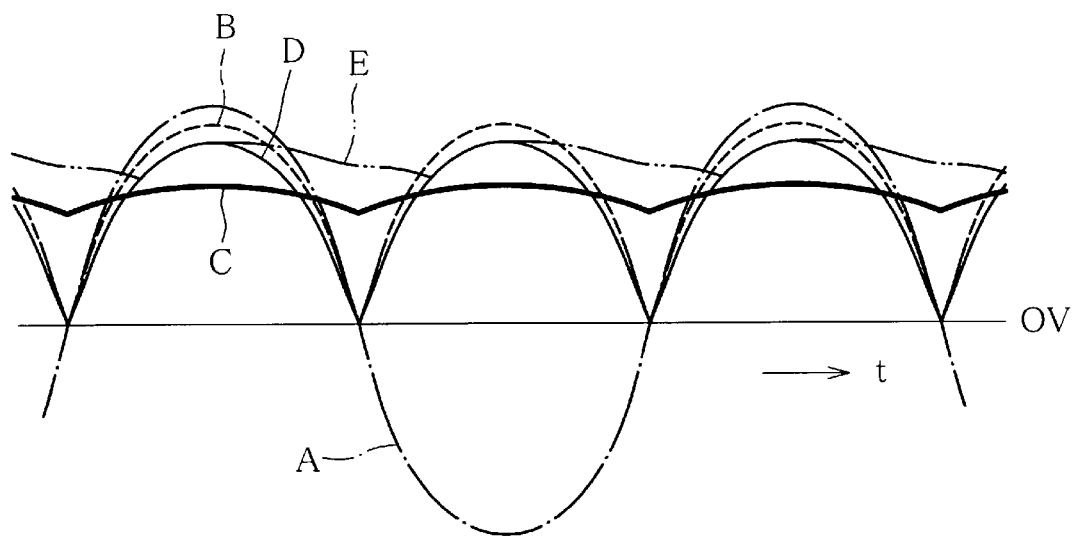
FIG. 10 is a waveform diagram showing characteristics of the rectifier circuits shown in FIGS. 5 and 6.

Accordingly, where the rectifier circuit 10 having the cross-connected structure as shown in FIG. 5 is constructed using the insulated-gate semiconductor devices having the above-identified element structure, the insulated-gate semiconductor devices (MOS transistors 11, 12, 13, 14) function as low-conductance transistors, thereby efficiently carrying out full-wave rectification of the input voltage. Furthermore, where a smoothing capacitor 15 is connected to the output side of the rectifier circuit 10, even though the voltage applied to the drain electrode D of the p-MOS transistor 11, 12 becomes higher than the input voltage applied to the gate electrode due to charging of the capacitor 15, the p-MOS transistors 11, 12 show low conductance. Thus, when the p-MOS transistor 11, 12 functions as a discharge path of the capacitor 15, the MOS transistor 11, 12 shows high resistance (i.e. low conductance), thereby restricting the discharge current. Accordingly, the full-wave rectified output obtained from the rectifier circuit 10 can be efficiently smoothed through the capacitor 15, so that the output voltage from the capacitor shows a stable waveform having a high output level (voltage) and smoothed along an envelope curve of the full-wave rectified output.

Moreover, with the insulated-gate semiconductor devices (MOS transistors 11, 12, 13, 14) having the aforementioned element structure, the p-MOS transistors 11, 12 show high resistance (low conductance) when acting as a discharge path for the capacitor 15 and thus restrict the discharge current. Thus, it is unnecessary to diodeconnect the p-MOS transistors 11 and 12, respectively, thereby eliminating the aforementioned disadvantage incurred by the diode-connection.

Figure 2:
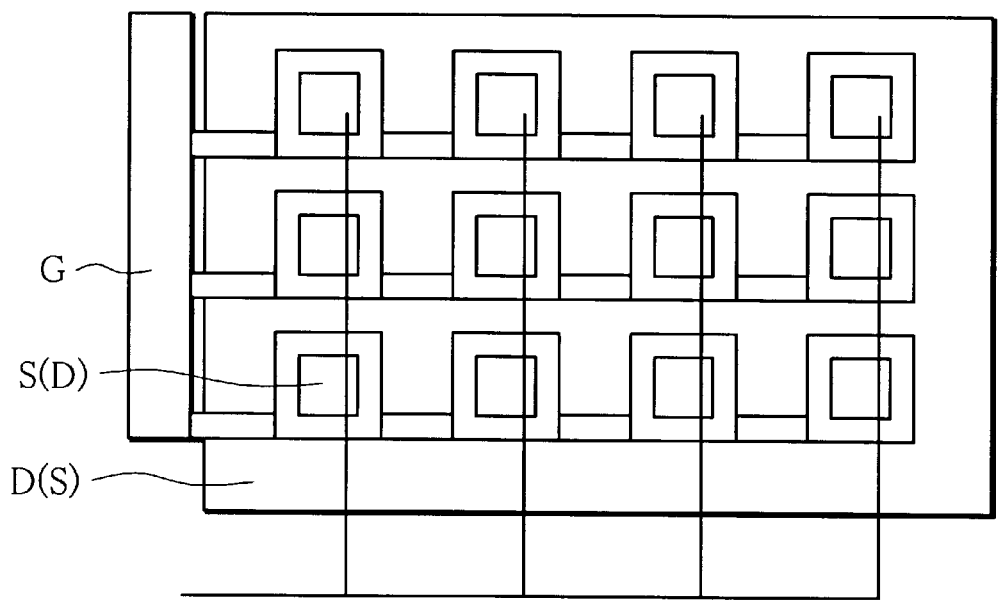
FIG. 2 is a plan view showing an arrangement pattern of source electrodes, drain electrodes and gate electrodes in an arrayed insulated-gate semiconductor device for a rectifier circuit in accordance with one embodiment of the present invention.
Figure 3:
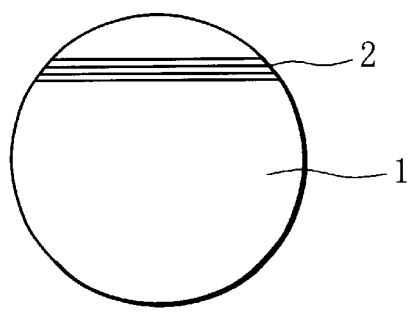
FIG. 3 is a view illustrating a ball semiconductor and a coil disposed on the surface thereof.
Figure 4:
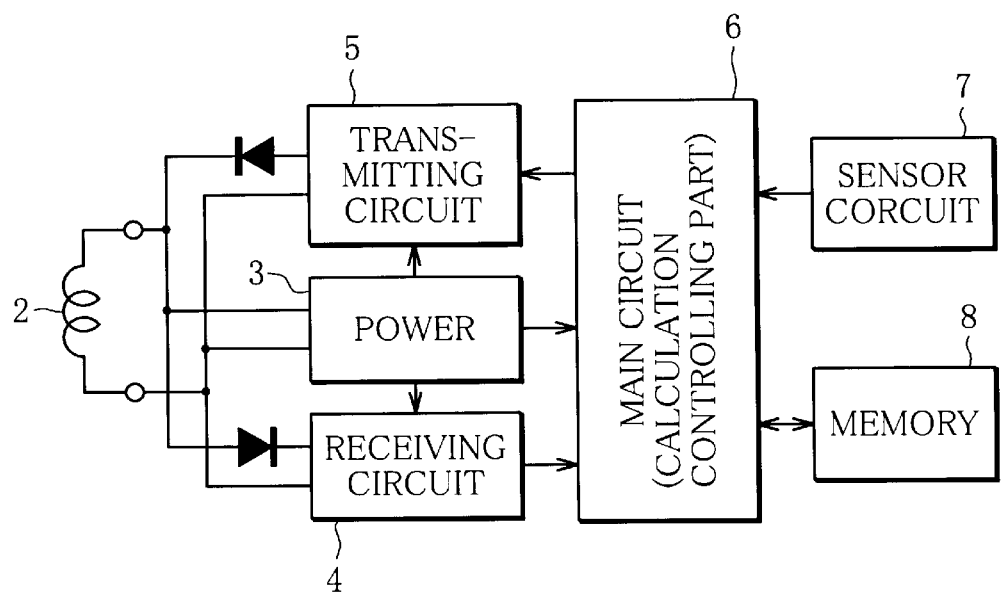
FIG. 4 is a diagram illustrating a schematic configuration of an integrated circuit included in a ball semiconductor.

In cases where a MOS transistor with the large current capacity is needed to design the rectifier circuit 10, a plurality of insulated-gate semiconductor devices having the element structure as shown in FIG. 1(a) or 1(b) may be connected in parallel to build an array as shown in FIG. 2, for example, thereby increasing the allowable current. To obtain the insulated-gate semiconductor device with the aforementioned structure in which the source and drain regions are asymmetrical, the shape of mask pattern for forming the source and drain regions on the semiconductor substrate may be suitably adjusted. Also, the shape of mask pattern has only to be suitably adjusted to form the insulating layer for forming the channel region and to shape the gate electrode formed on the insulating layer.

It should be noted that the scope of the present invention is not limited to the aforementioned embodiments. For instance, the effective channel length of the channel region formed immediately under the gate electrode G may be determined to conform to the characteristics required for the transistor. The width (channel width) over which the asymmetrically arranged source and the drain regions adjoin the channel region may also be determined to conform to the conductance necessary to realize the rectifier circuit. Additionally, it is not essential to form the channel region so as to surround the source region. The channel region may be formed into a semicircular shape, and the source and drain regions may be formed on both sides of the region. It is to be noted that the present invention can be modified in various ways without departing from the scope and spirit of the invention.

Industrial Applicability

According to the present invention, there is provided an insulated-gate semiconductor device (MOS transistor) wherein the source and drain regions are disposed asymmetrical with respect to the channel region. The semiconductor device of the present invention is suited to realize a rectifier circuit capable of stably obtaining an envelope-curved output of a full-wave rectified waveform. The insulated-gate semiconductor device of the present invention is especially suited to be incorporated into a rectifier circuit which performs full-wave rectification of power supplied thereto by inductive coupling of coils to generate internal power.

What is claimed is:

1. An insulated-gate semiconductor device for a rectifier circuit, comprising:

a plurality of n-MOS transistors and a plurality of n-MOS transistors formed on a predetermined semiconductor substrate;

wherein at least two pairs of P-MOS transistors and n-MOS transistors are bridge-connected to form a full-wave rectifier circuit, and alternating-current input applied to a gate in each of the MOS transistors is full-wave rectified by controlling operation of each of the MOS transistors;

wherein each of the MOS transistors includes a source region, a drain region formed on the semiconductor substrate at a distance from the source region, and a gate electrode formed on the semiconductor substrate with an insulating layer interposed therebetween to form a channel region between the source region and the drain region; and wherein the source region includes a plurality of source regions formed on the semiconductor substrate at predetermined intervals, the drain region includes a plurality of drain regions each surrounding a corresponding one of the source regions, source electrodes are formed on the respective source regions and connected in parallel, and the gate electrode includes a plurality of gate electrodes each forming a channel region between a corresponding one of the source regions and a drain region associated therewith and connected in parallel, whereby the MOS transistors constitute an array configuration.

2. An insulated-gate semiconductor device for a rectifier circuit, comprising:

a plurality of P-MOS transistors and a plurality of n-MOS transistors formed on a predetermined semiconductor substrate;

wherein at least two pairs of p-MOS transistors and n-MOS transistors are bridge-connected to form a full-wave rectifier circuit, and alternating-current input applied to a gate in each of the MOS transistors is full-wave rectified by controlling operation of each of the MOS transistors;

wherein each of the MOS transistors includes a source region, a drain region formed on the semiconductor substrate at a distance from the source region, and a gate electrode formed on the semiconductor substrate with an insulating layer interposed therebetween to form a channel region between the source region and the drain region;

wherein the drain region and the source region are asymmetrical with respect to the channel region; and wherein said full-wave rectifier circuit performs full-wave rectification of alternating-current power supplied thereto by inductive coupling with a coil.

3. The insulated-gate semiconductor device for a rectifier circuit according to claim 1, wherein the semiconductor substrate comprises a ball semiconductor.

4. An insulated-gate semiconductor device for a rectifier circuit, comprising:

a plurality of p-MOS transistors and a plurality of n-MOS transistors formed on a predetermined semiconductor substrate;

wherein at least two pairs of p-MOS transistors and n-MOS transistors are bridqe-connected to form a full-wave rectifier circuit, and alternatina-current input applied to a gate in each of the MOS transistors is full-wave rectified by controlling operation of each of the MOS transistors;

wherein each of the MOS transistors includes a source region, a drain region formed on the semiconductor substrate at a distance from the source region, and a gate electrode formed on the semiconductor substrate with an insulating layer interposed therebetween to form a channel region between the source region and the drain region;

wherein said channel region of each of the MOS transistors is disposed to surround the corresponding source region, and the drain region is disposed around the corresponding channel region; and wherein said full-wave rectifier circuit performs full-wave rectification of alternating-current power supplied thereto by inductive coupling with a coil.

5. The insulated-gate semiconductor device for a rectifier circuit according to claim 1, wherein said full-wave rectifier circuit performs full-wave rectification of alternating-current power supplied thereto by inductive coupling with a coil.

* * * * *